(12) United States Patent
Inuzuka et al.

(10) Patent No.: US 11,231,295 B2
(45) Date of Patent: Jan. 25, 2022

(54) ROTATION ANGLE DETECTION DEVICE

(71) Applicant: DENSO CORPORATION, Kariya (JP)

(72) Inventors: Yoshinori Inuzuka, Kariya (JP); Yoshiyuki Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 19 days.

(21) Appl. No.: 16/924,366

(22) Filed: Jul. 9, 2020

(65) Prior Publication Data

US 2020/0340832 A1 Oct. 29, 2020

Related U.S. Application Data

(63) Continuation of application No. PCT/JP2019/000682, filed on Jan. 11, 2019.

(30) Foreign Application Priority Data

Jan. 16, 2018 (JP) .............................. JP2018-004645

(51) Int. Cl.
| | | |
|---|---|---|
| *G01R 15/20* | (2006.01) | |
| *G01D 5/14* | (2006.01) | |
| *G01B 7/30* | (2006.01) | |
| *G01D 11/24* | (2006.01) | |
| *G01R 33/07* | (2006.01) | |

(52) U.S. Cl.
CPC .............. *G01D 5/145* (2013.01); *G01B 7/30* (2013.01); *G01D 11/245* (2013.01); *G01R 33/07* (2013.01)

(58) Field of Classification Search
CPC ........ G01B 7/30; G01D 11/245; G01D 5/145; G01R 33/07
See application file for complete search history.

(56) References Cited

U.S. PATENT DOCUMENTS

| | | | |
|---|---|---|---|
| 2006/0267581 A1 | 11/2006 | Wiese | |
| 2010/0060268 A1* | 3/2010 | Tokunaga | ................ G01B 7/30 324/207.2 |
| 2011/0175600 A1 | 7/2011 | Jerance et al. | |
| 2017/0292856 A1 | 10/2017 | Takiguchi et al. | |

* cited by examiner

*Primary Examiner* — Alesa Allgood
(74) *Attorney, Agent, or Firm* — Nixon & Vanderhye P.C.

(57) ABSTRACT

A rotation angle detection device for detecting a rotation angle of a rotating body includes a magnet having poles arranged along a radial direction perpendicular to a rotation axis of the rotating body, the magnet being disposed to rotate together with the rotating body, a magnetic portion provided in a ring shape radially outward of the magnet, a plurality of gaps being formed in the magnetic portion at a plurality of locations along a circumferential direction, and a magnetic detection unit arranged in a particular gap of the plurality of gaps, the magnetic detection unit being configured to detect a tangential magnetic flux component in a tangential direction and a radial magnetic flux component in the radial direction of a magnetic field.

5 Claims, 7 Drawing Sheets

ROTATION ANGLE DETECTION DEVICE

CROSS REFERENCE TO RELATED APPLICATIONS

The present application is a continuation application of International Patent Application No. PCT/JP2019/000682 filed on Jan. 11, 2019, which designated the U.S. and claims the benefit of priority from Japanese Patent Application No. 2018-4645 filed on Jan. 16, 2018, the disclosures of which are incorporated herein by reference.

TECHNICAL FIELD

The present disclosure relates to a rotation angle detection device.

BACKGROUND

Conventionally, rotation angle detection devices are known to include a magnetic detection unit disposed radially outward with respect to a magnet that rotates with a rotating body, and known to detect a tangential magnetic flux component and a radial magnetic flux component of the magnetic field to determine a rotation angle of the rotating body based on the detected values.

SUMMARY

According to one aspect of the present disclosure, a rotation angle detection device for detecting a rotation angle of a rotating body includes a magnet having poles arranged along a radial direction perpendicular to a rotation axis of the rotating body, the magnet being disposed to rotate together with the rotating body, a magnetic portion provided in a ring shape radially outward of the magnet, a plurality of gaps being formed in the magnetic portion at a plurality of locations along a circumferential direction, and a magnetic detection unit arranged in a particular gap of the plurality of gaps, the magnetic detection unit being configured to detect a tangential magnetic flux component in a tangential direction and a radial magnetic flux component in the radial direction of a magnetic field.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Various embodiments will be described with reference to the drawings. In the embodiments, components which are substantially similar to each other are denoted by the same reference numerals and redundant description thereof is omitted. The drawings showing the structure of the device are schematically drawn for easy understanding of the configuration. The dimensions, angles and dimensional ratios in the drawings are not necessarily limiting.

First Embodiment

In the field of rotation angle detection devices, there is a tendency for the magnetic field outward of a detection magnet to be formed such that the tangential magnetic flux component is much smaller than the radial magnetic flux component. To address, one proposes solution is to provide an electronic circuit for adjusting the gain of the output signal of the magnetic detection element in the tangential direction. However, this solution raises concerns in that the structure of the device may become complicated, and in addition, increasing gain also increases noise, and therefore reduces detection accuracy.

Figure 1:
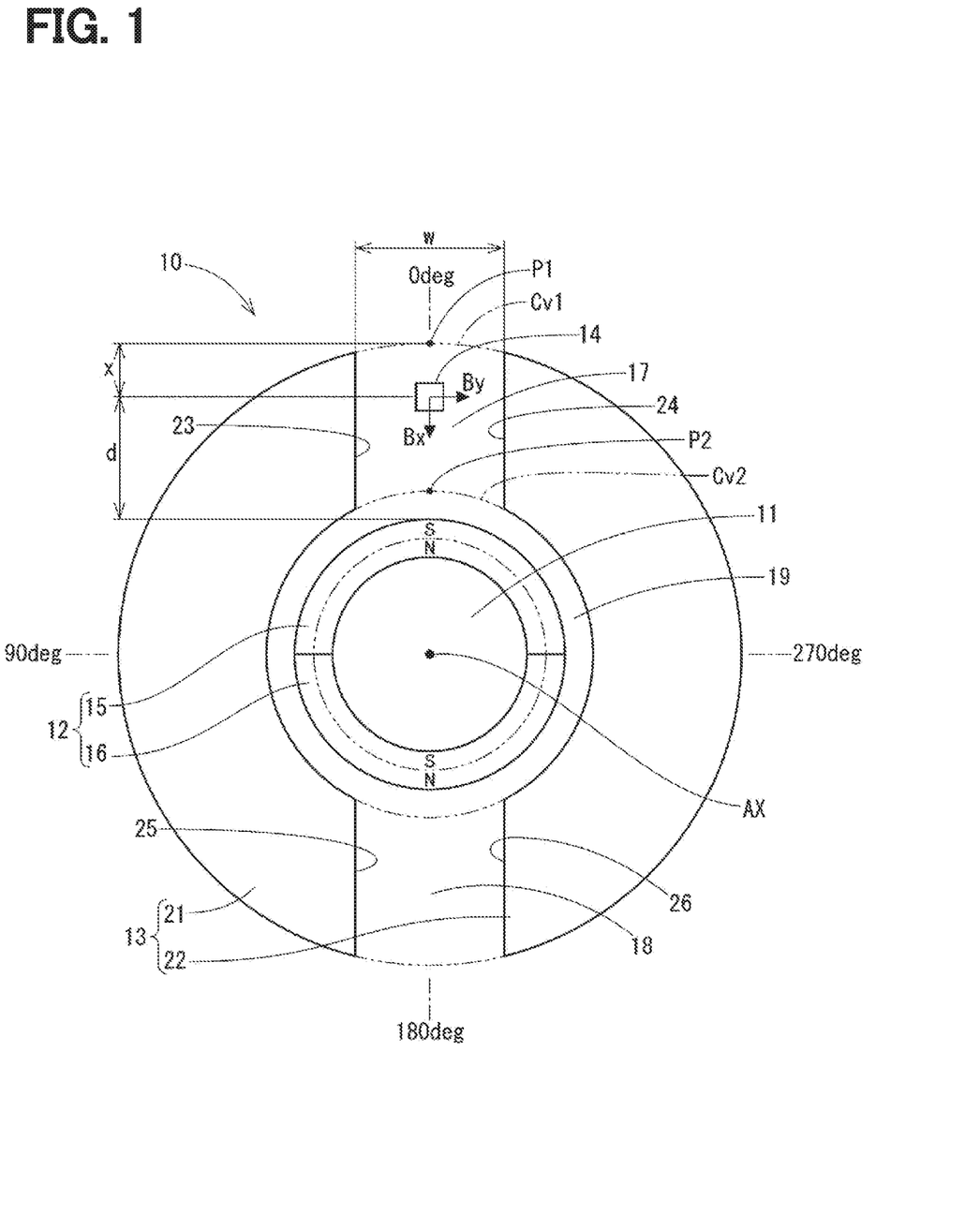
FIG. 1 is a schematic diagram schematically showing a rotation angle detection device according to a first embodiment.

In this regard, FIG. 1 shows a rotation angle detection device 10 according to the first embodiment. The rotation angle detection device 10 is a device that detects the rotation angle of a rotating body 11, and includes a magnet 12, a magnetic portion 13, and a magnetic detection unit 14. The rotation angle signal from the magnetic detection unit 14 is transmitted to an external ECU (Electronic Control Unit) or the like (not shown).

In the following description, directions perpendicular to the rotation axis AX of the rotating body 11 are referred to as the "radial direction". Directions tangent to a circle centered on the rotation axis AX in the cross section of the rotating body 11 are referred to as "tangential direction". Further, the rotation direction of the rotating body 11 is simply referred to as "rotation direction".

The magnet 12 has poles arranged along the radial direction of the rotating body 11. These poles includes a north pole and a south pole. In the first embodiment, the magnet 12 includes a first magnet portion 15 and a second magnet portion 16 that are arc-shaped along the rotation direction. The N pole and the S pole are arranged in the thickness direction of the first magnet portion 15 and the second magnet portion 16. The first magnet portion 15 is fixed to one side surface of the rotating body 11. The second magnet portion 16 is fixed to the other side surface of the rotating body 11. The magnet 12 rotates together with the rotating body 11.

The magnetic portion 13 is arranged in a ring shape around the magnet 12, i.e., radially outward with respect to the magnet 12, and has gaps 17 and 18 at a plurality of positions along the circumferential direction. The magnetic portion 13 is radially spaced apart from the magnet 12. Specifically, an annular gap 19 is formed between the magnet 12 and the magnetic portion 13. In the first embodiment, the magnetic portion 13 includes a first magnetic body 21 and a second magnetic body 22 that are arc-shaped along the rotation direction. The first magnetic body 21 is arranged on one side in the radial direction with respect to the magnet 12. The second magnetic body 22 is provided on the opposite side of the magnet 12 from the first magnetic body 21. A gap 17 is formed between one circumferential end 23 of the first magnetic body 21 and the other circumferential end 24 of the second magnetic body 22. A gap 18 is formed between the other circumferential end 25 of the first magnetic body 21 and one circumferential end 26 of the second magnetic body 22. The magnetic portion 13 is integrally held together by, for example, a fixing member (not shown).

The first magnetic body 21 and the second magnetic body 22 are arranged point-symmetrically to each other with respect to the rotation axis AX. The gap 17 and the gap 18 are formed point-symmetrically to each other with respect to the rotation axis AX. That is, the gap 17 and the gap 18 have the same width in the tangential direction (i.e., tangential width) and are located at diametrically opposite positions as each other with respect to the rotation axis AX.

The magnetic detection unit 14 is disposed in the gap 17. The magnetic detection unit 14 is configured to detect a tangential component of the magnetic flux density of the magnetic field (hereinafter, a "tangential magnetic flux component") and a radial component of the magnetic flux density of the magnetic field (hereinafter, a "radial magnetic flux component"). The gap 17 is a particular gap of one of the gaps 17 and 18. Hereinafter, the gap 17 may be referred to as "particular gap 17" where appropriate. The magnetic detection unit 14, similar to the magnetic portion 13, is integrally held together by the fixing member or the like.

Figure 2:
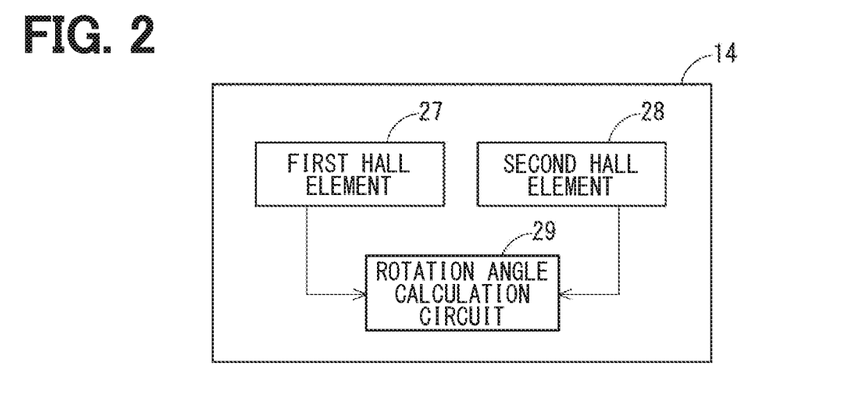
FIG. 2 is a block diagram illustrating a magnetic detection unit according to the first embodiment.

In the first embodiment, the magnetic detection unit 14 includes a first Hall element 27, a second Hall element 28, a rotation angle calculation circuit 29, and the like as shown in FIG. 2.

Figure 3:
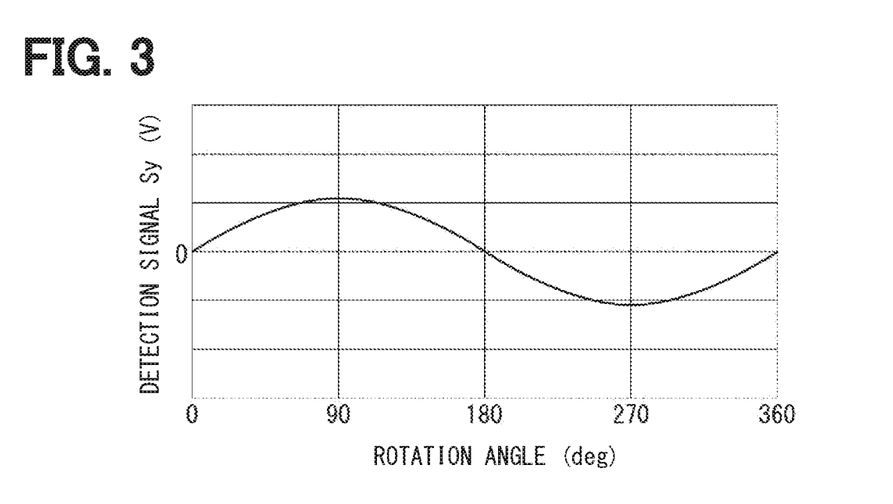
FIG. 3 is a diagram illustrating a relationship between rotation angle of a rotating body and an output signal of a first Hall element in the first embodiment.
Figure 4:
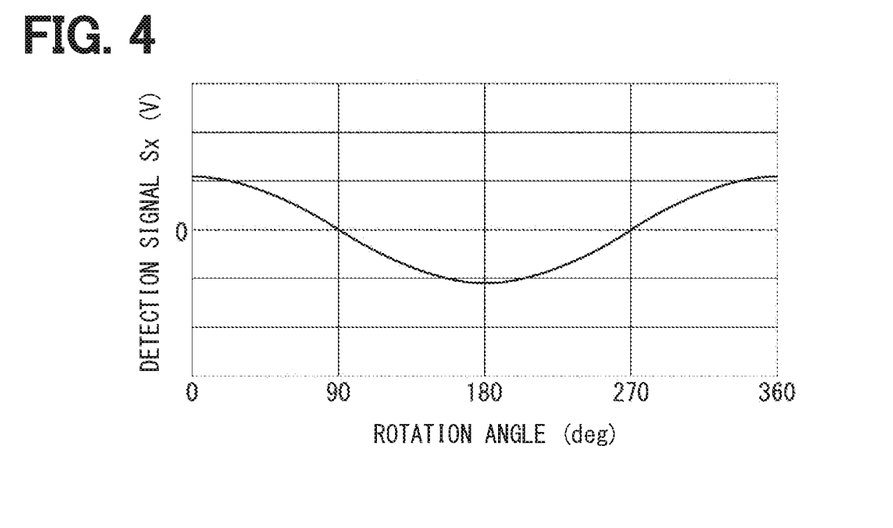
FIG. 4 is a diagram illustrating a relationship between rotation angle of a rotating body and an output signal of a second Hall element in the first embodiment.

The first Hall element 27 detects a radial magnetic flux component of the magnetic field at the position where the magnetic detection unit 14 is disposed. The second Hall element 28 detects a tangential magnetic flux component of the magnetic field at the position where the magnetic detection unit 14 is disposed. The first Hall element 27 and the second Hall element 28 are arranged such that the directions of their detection surfaces are offset from each other by 90°. As shown in FIG. 3, the second Hall element 28 outputs an output signal Sy based on the tangential magnetic flux component. The output signal Sy is a Sin waveform signal. As shown in FIG. 4, the first Hall element 27 outputs an output signal Sx based on the radial magnetic flux component. The output signal Sx is a Cos waveform signal. The Sin waveform signal and the Cos waveform signal have a phase difference of 90° from each other.

In FIG. 1, a radial distance x refers to the distance from a predetermined reference position P1 to the magnetic detection unit 14. Further, a maximum magnetic flux value B refers to the maximum value of the magnetic flux component at the location where the magnetic detection unit 14 is disposed. Next, the relationship between the radial distance x and the maximum magnetic flux value B will be explained. The reference position P1 is on an imaginary circle Cv1 circumscribing the magnetic portion 13 and is at the center of the tangential width w of the particular gap 17. The tangential width w of the particular gap 17 may be, for example, 5.5 mm over the entire range from the reference position P1 to an inner position P2. The inner position P2 is on an imaginary circle Cv2 circumscribing the magnetic portion 13 and is at the center of the tangential width w of the particular gap 17. The maximum magnetic flux value B refers to the maximum value of a magnetic flux component over the entire 360° rotation angle range of the rotating body 11. In the discussion below, references to adjusting the radial distance x are made, and in practice this refers to adjusting a radial distance d between the magnetic detection unit 14 and the magnet 12.

Figure 5:
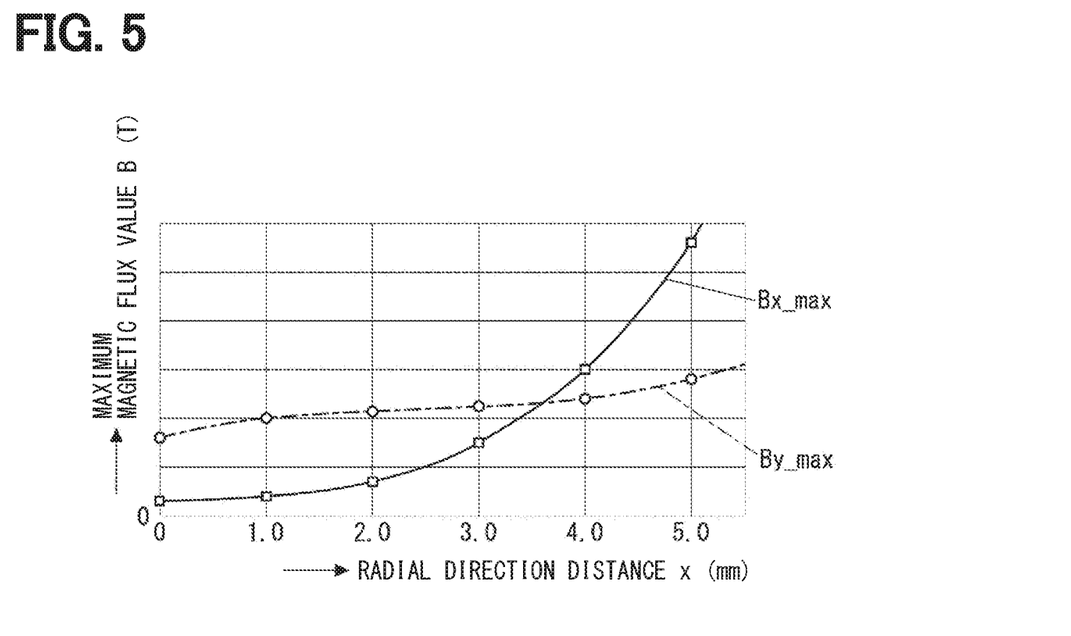
FIG. 5 is a diagram illustrating a relationship between a radial position of a magnetic detection unit and a maximum magnetic flux value of a radial magnetic flux component, and a relationship between a radial position of a magnetic detection unit and a maximum magnetic flux value of a tangential magnetic flux component in the first embodiment.

As shown in FIG. 5, as the radial distance x is increased from 0 to 5.0 mm, the maximum magnetic flux value Bx_max of the radial magnetic flux component increases exponentially. On the other hand, as the radial distance x increased from 0 to 5.0 mm, the maximum magnetic flux value By_max of the tangential magnetic flux component does not change much. In other words, the maximum magnetic flux value By_max increases very slowly or does not change.

Figure 6:
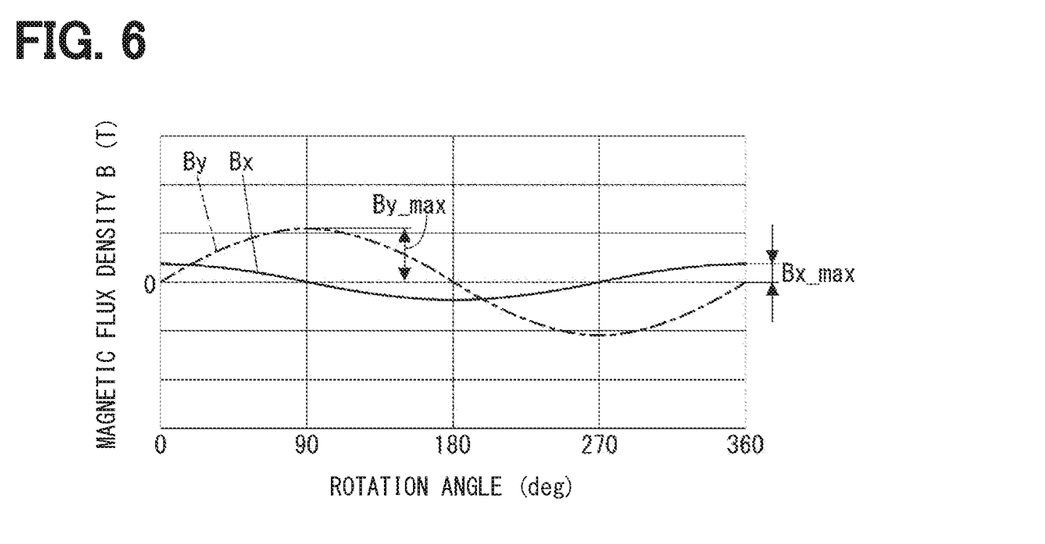
FIG. 6 is a diagram showing a relationship between rotation angle of a rotating body and a radial magnetic flux component, and a relationship between rotation angle of a rotating body and a tangential magnetic flux component, in a first embodiment.

Returning to FIG. 1, the first Hall element 27 is a horizontal Hall element. The second Hall element 28 is a vertical Hall element with a lower sensitivity than the horizontal Hall element. Assuming that the ratio between the detection sensitivity of the radial magnetic flux component by the first Hall element 27 and the detection sensitivity of the tangential magnetic flux component by the second Hall element 28 is a sensitivity ratio α, in the first embodiment, the sensitivity ratio α is 3:1. In addition, the magnetic detection unit 14 is disposed at the center of the tangential width w of the particular gap 17 and at a position where the radial distance x=2.0. Assuming that the ratio between the maximum magnetic flux value Bx_max and the maximum magnetic flux value By_max is a magnetic flux component ratio β, the magnetic flux component ratio β is 1:3 as shown in FIGS. 5 and 6. As a result, the radial distance d between the magnetic detection unit 14 and the magnet 12 is adjusted such that the difference between the magnetic flux component ratio β and the inverse of the sensitivity ratio α is smaller as compared to when the magnetic detection unit 14 is located at the radial center of the particular gap 17 (radial distance x=2.75). In particular, in the first embodiment, the radial distance d is adjusted such that the magnetic flux component ratio β matches the inverse of the sensitivity ratio α.

By adjusting the radial distance d as described above such that the magnetic flux component ratio β equals the inverse ratio of the sensitivity ratio α, the amplitude of the output signal Sy becomes the equal to the amplitude of the output signal Sx (see FIGS. 3 and 4). The rotation angle calculation circuit 29 performs an arc tangent calculation based on the output signal Sy and the output signal Sx to calculate a 360° rotation angle of the rotating body 11.

Effects

As described above, in the first embodiment, the rotation angle detection device 10 includes the magnet 12, the magnetic portion 13, and the magnetic detection unit 14. The magnet 12 has poles arranged in a radial direction perpendicular to the rotation axis AX of the rotating body 11, and rotates together with the rotating body 11. The magnetic portion 13 is arranged in a ring shape radially outward with respect to the magnet 12, and has gaps 17 and 18 at a plurality of positions along the circumferential direction. The magnetic detection unit 14 is disposed in one particular gap 17 of the plurality of gaps 17 and 18 and is configured to detect a tangential magnetic flux component and a radial magnetic flux component of a magnetic field.

Therefore, a 360° rotation angle of the rotating body 11 can be calculated by performing an arc tangent operation based on the Sin waveform signal and the Cos waveform from the detection values of the magnetic detection unit 14.

Further, the ring-shaped magnetic portion 13 is disposed around the magnet 12, and the magnetic detection unit 14 is disposed within the particular gap 17 of the magnetic portion 13 to optimize the balance between the tangential magnetic flux component detected by the magnetic detection unit 14 and the radial magnetic flux component detected by the magnetic detection unit 14. In other words, the ratio between the tangential magnetic flux component and the radial magnetic flux component can be designed to have a desired value. Therefore, it is not necessary to increase the gain of the output signal based on one of the magnetic flux components, and an electronic circuit for adjusting gain is not required. Further, since the gain is not increased, a decrease in detection accuracy due to an increase in noise does not occur. Therefore, the structure of the rotation angle detection device 10 is simplified, and detection accuracy is also improved.

In the first embodiment, the magnetic detection unit 14 includes the first Hall element 27 that detects the radial magnetic flux component of the magnetic field, and the second Hall element 28 that detects the tangential magnetic flux component of the magnetic field. The first Hall element 27 is a horizontal Hall element. The second Hall element 28 is a vertical Hall element with a lower sensitivity than the horizontal Hall element. As a result, the sensitivity ratio α matches the magnetic flux component ratio β obtained from the magnetic characteristics of the location where the magnetic detection unit 14 is disposed.

Further, in the first embodiment, the radial distance d between the magnetic detection unit 14 and the magnet 12 is adjusted such that the difference between the magnetic flux component ratio β and the inverse of the sensitivity ratio α is smaller as compared to when the magnetic detection unit 14 is located at the radial center of the particular gap 17. In particular, in the first embodiment, the radial distance d is adjusted such that the magnetic flux component ratio β matches the inverse of the sensitivity ratio α. As a result, detection accuracy can be further improved.

Second Embodiment

Figure 7:
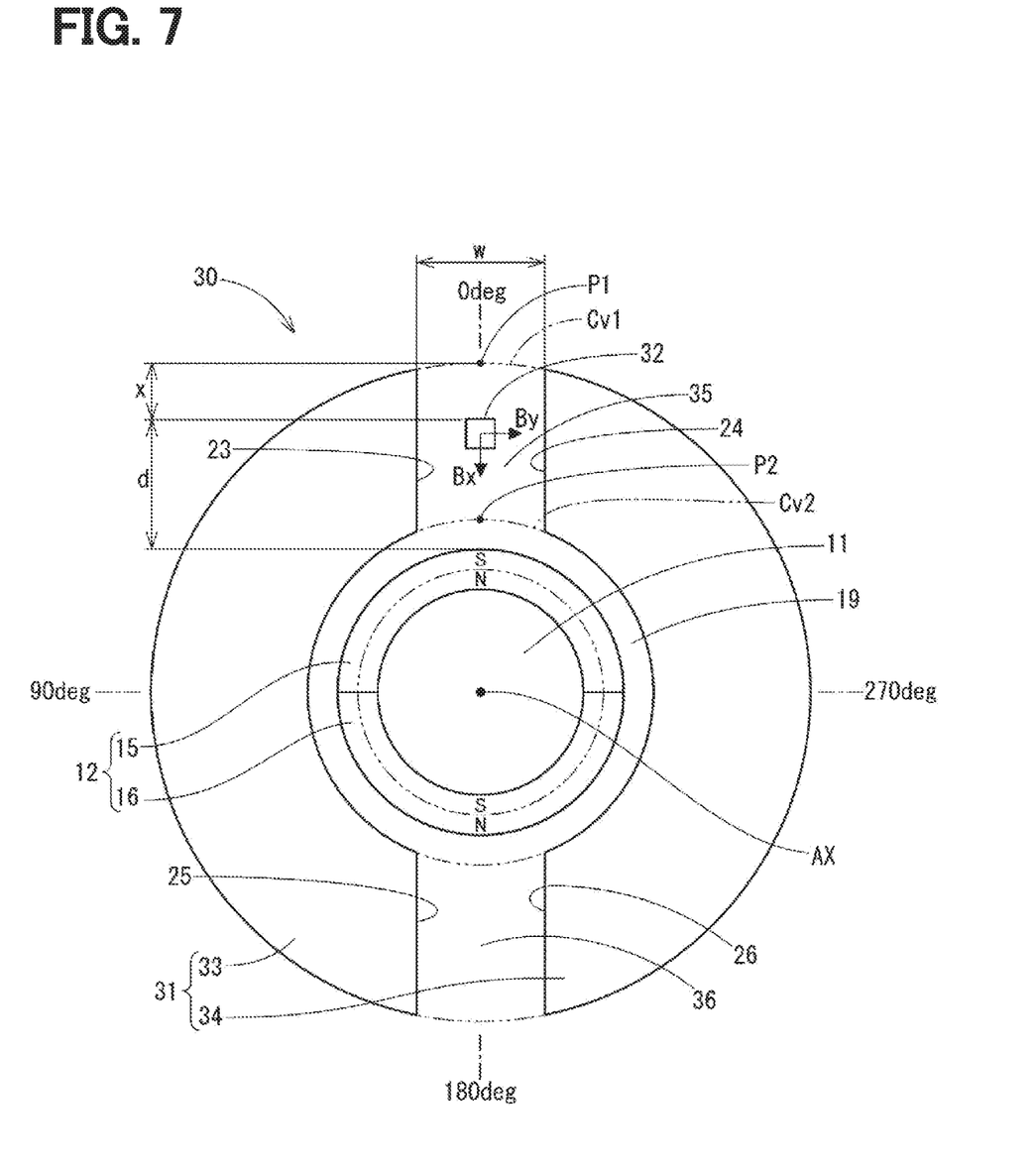
FIG. 7 is a schematic diagram schematically showing a rotation angle detection device according to a second embodiment.

In the second embodiment, as shown in FIG. 7, the rotation angle detection device 30 includes the magnet 12, the magnetic portion 31, and the magnetic detection unit 32. The magnetic portion 31 includes an arc-shaped first magnet portion 33 and a second magnet portion 34, and includes gaps 35 and 36. The magnetic detection unit 32 is provided in the gap 35 (hereinafter, the particular gap 35).

Figure 8:
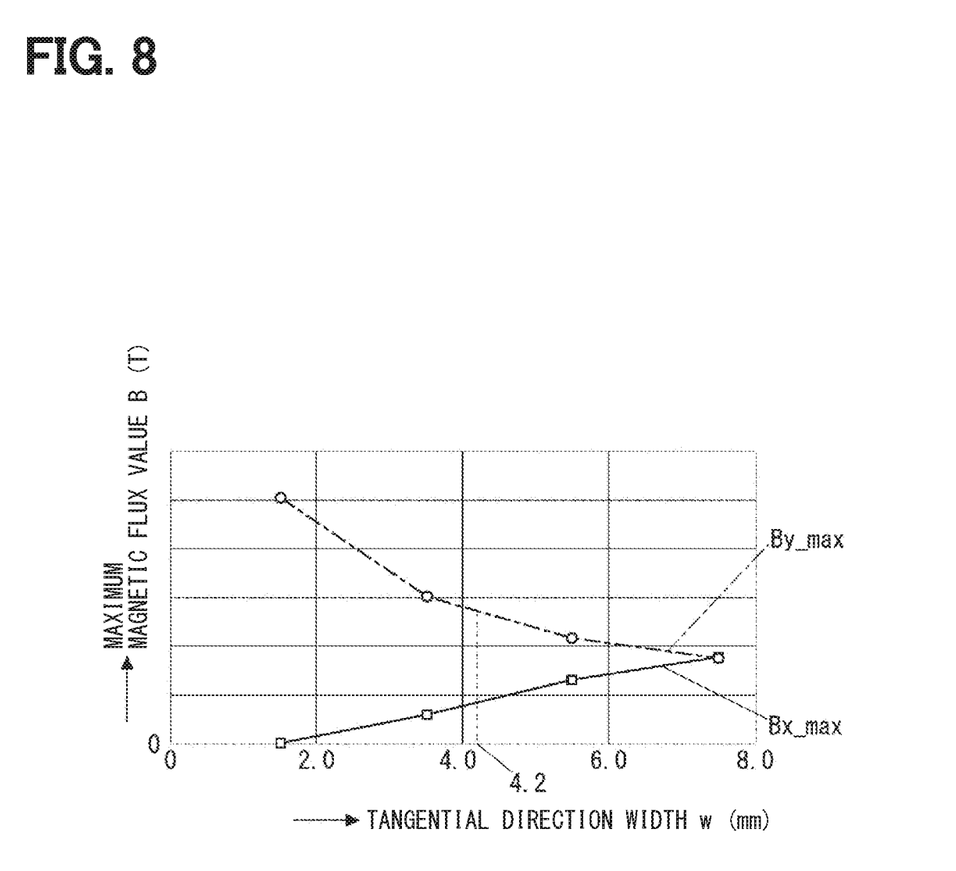
FIG. 8 is a diagram illustrating a relationship between a tangential width of a particular gap and a maximum magnetic flux value of a radial magnetic flux component, and a relationship between a tangential width of a particular gap and a maximum magnetic flux value of a tangential magnetic flux component in the second embodiment.

Here, the relationship between the tangential width w of the particular gap 35 and the maximum magnetic flux value B at the location where the magnetic detection unit 32 is located will be described. The radial distance x is, for example, 2.5 mm. As shown in FIG. 8, as the tangential width w increases from 1.5 to 7.5 mm, the maximum magnetic flux value By_max of the tangential magnetic flux component decreases. On the other hand, as the tangential width w increases from 1.5 to 7.5 mm, the maximum magnetic flux value Bx_max of the radial magnetic flux component increases.

Returning to FIG. 7, in the second embodiment, the sensitivity ratio α is 3:1. The tangential width w is 4.2 mm, and the magnetic flux component ratio β is 1:3 as shown in FIG. 8. As a result, the tangential width w of the particular gap 35 is adjusted such that the difference between the magnetic flux component ratio β and the inverse ratio of the sensitivity ratio α is smaller as compared to when the tangential width w of the particular gap 35 is the minimum required width. The minimum required width is a minimum width in the tangential direction necessary for providing the magnetic detection unit 14. In particular, in the second embodiment, the tangential width w of the particular gap 35 is adjusted such that the magnetic flux component ratio β equals the inverse ratio of the sensitivity ratio α.

By adjusting the tangential width was described above such that the magnetic flux component ratio β equals the inverse ratio of the sensitivity ratio α, the amplitude of the output signal Sy becomes the equal to the amplitude of the output signal Sx, similar to the first embodiment.

Effects

As described above, in the second embodiment as well, the ring-shaped magnetic portion 31 is provided radially outward of the magnet 12. The magnetic detection unit 32 is disposed in one particular gap 35 of the plurality of gaps 35, 36 and is configured to detect a tangential magnetic flux component and a radial magnetic flux component of a magnetic field. As a result, similarly to the first embodiment, the structure of the rotation angle detection device 10 is simplified, and detection accuracy is improved.

Also in the second embodiment, the first Hall element 27 of the magnetic detection unit 32 is a horizontal Hall element, and the second Hall element 28 is a vertical Hall element. Therefore, as in the first embodiment, the sensitivity ratio α is matched with the magnetic flux component ratio β obtained from the magnetic characteristics at the location of the magnetic detection unit 32.

Further, in the second embodiment, the tangential width w of the particular gap 35 is adjusted such that the difference between the magnetic flux component ratio β and the inverse ratio of the sensitivity ratio α is smaller as compared to when the tangential width w of the particular gap 35 is the minimum required width. In particular, in the second embodiment, the tangential width w of the particular gap 35 is adjusted such that the magnetic flux component ratio β equals the inverse ratio of the sensitivity ratio α. As a result, detection accuracy can be further improved.

Other Embodiments

In another embodiment, the radial distance of the magnetic detection unit and the tangential width of the particular gap can both be adjusted as appropriate. In other words, the balance between the tangential magnetic flux component and the radial magnetic flux component detected by the magnetic detection unit may be optimized while changing both the radial distance and the tangential width. Further, in another embodiment, the magnetic detection unit may be provided at a position offset from the center of the tangential width of the particular gap.

For example, in another embodiment, the sensitivity ratio α can be designed to be 1:1 by setting the magnetic flux component ratio β to 1:1 and setting the radial distance x=3.6 mm as shown in FIG. 5. Further, in another embodiment, the sensitivity ratio α can be designed to be 1:2 by setting the magnetic flux component ratio β to 2:1 and setting the radial distance x=5.0 mm as shown in FIG. 5.

Figure 9:
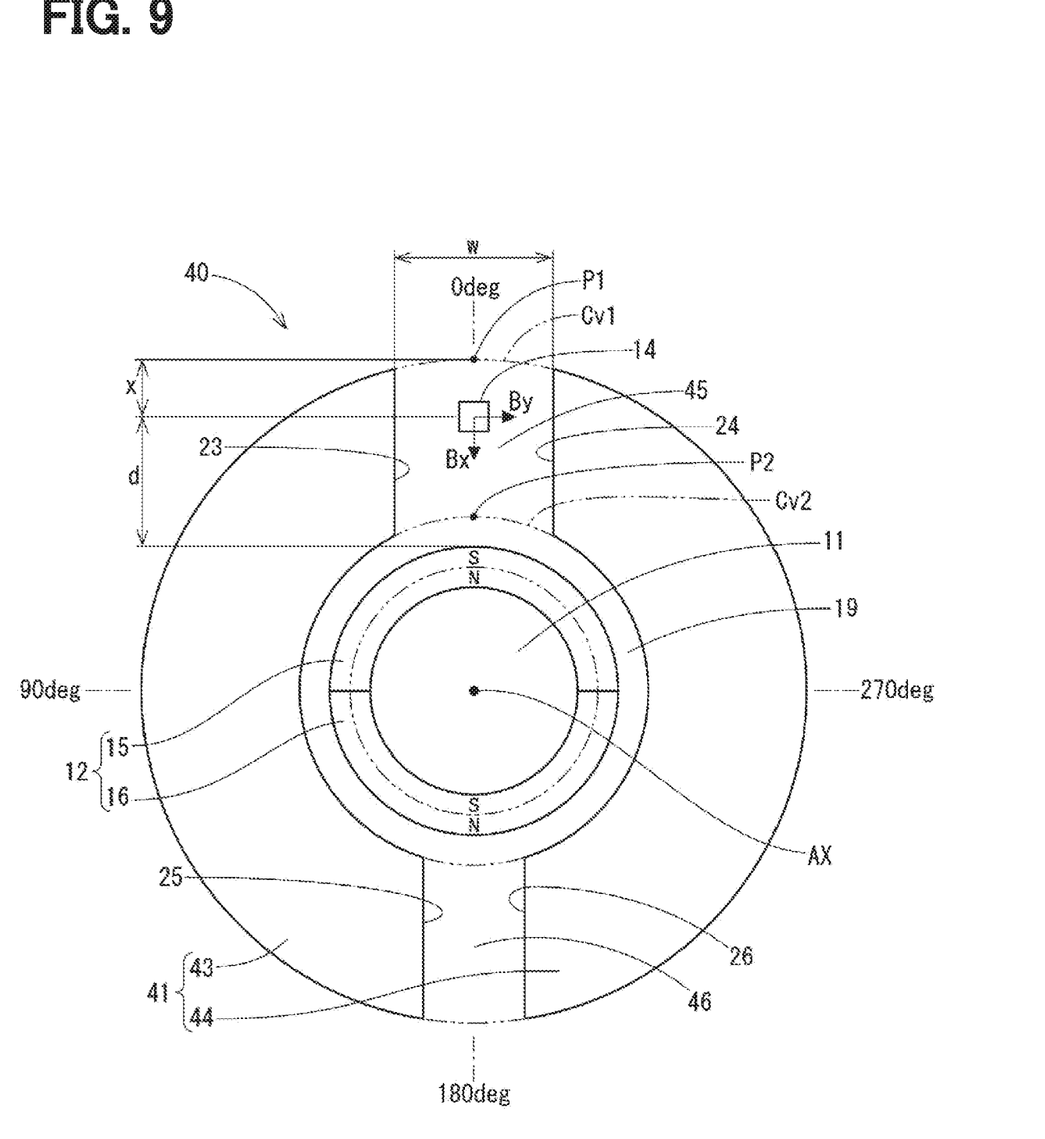
FIG. 9 is a schematic diagram schematically showing a rotation angle detection device according to a first other embodiment.

In other embodiments, the tangential direction widths of the gaps of the magnetic portion may be different from each other. For example, as shown in FIG. 9, the magnetic portion 41 of the rotation angle detection device 40 has a first magnet portion 43 and a second magnet portion 44. The particular gap 45 is larger than the other gap 46. In addition, in other embodiments, the particular gap may be smaller than the other gap.

Figure 10:
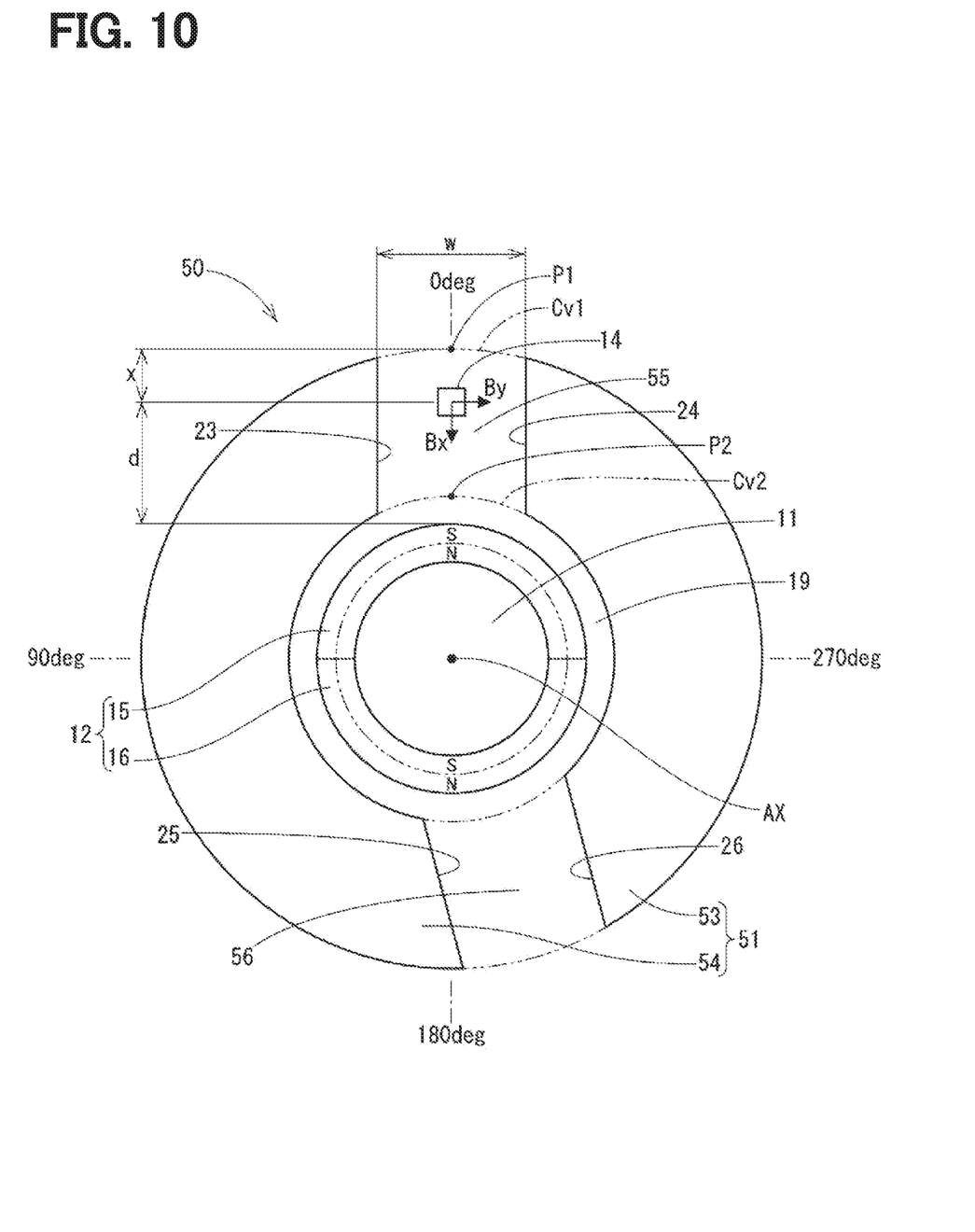
FIG. 10 is a schematic diagram schematically showing a rotation angle detection device according to a second other embodiment.

In another embodiment, the gaps of the magnetic portion may not be provided point-symmetrically with respect to the rotation axis. For example, as shown in FIG. 10, the magnetic portion 51 of the rotation angle detection device 50 has a first magnet portion 53 and a second magnet portion 54. The other gap 56 is offset from a position directly opposite to the particular gap 55 across the rotation axis AX.

Further, in another embodiment, the magnet is not limited to having two magnet portions, and may be formed of 1 magnet portion, or three or more magnet portions. Further, the arrangement and magnetization of each magnet portion are not limited to those described above. In short, the magnet only needs to have a pole arranged in the radial direction perpendicular to the rotation axis of the rotating body.

In another embodiment, the rotation angle calculation circuit may be provided outside the magnetic detection unit instead of within the magnetic detection unit. In another embodiment, the magnetic detection unit is not limited to a Hall element, and may use another magnetic sensor such as an MR element. Further, in another embodiment, the magnetic detection unit may detect the tangential magnetic flux component and the radial magnetic flux component with a single element.

The present disclosure has been described based on the embodiments. However, the present disclosure is not limited to the embodiments and structures. This disclosure also encompasses various modifications and variations within the scope of equivalents. Furthermore, various combination and formation, and other combination and formation including one, more than one or less than one element may be made in the present disclosure.

The invention claimed is:

1. A rotation angle detection device for detecting a rotation angle of a rotating body, comprising:
   a magnet having poles arranged along a radial direction perpendicular to a rotation axis of the rotating body, the magnet being disposed to rotate together with the rotating body;
   a magnetic portion provided in a ring shape radially outward of the magnet, a plurality of gaps being formed in the magnetic portion at a plurality of locations along a circumferential direction; and
   a magnetic detection unit arranged in a particular gap of the plurality of gaps, the magnetic detection unit being configured to detect a tangential magnetic flux component in a tangential direction and a radial magnetic flux component in the radial direction of a magnetic field, wherein
   a ratio between a detection sensitivity of the tangential magnetic flux component and a detection sensitivity of the radial magnetic flux component by the magnetic detection unit is defined as a sensitivity ratio,
   a ratio between a maximum value of the tangential magnetic flux component of the magnetic field and a maximum value of the radial magnetic flux component at the location of the magnetic detection unit is defined as a magnetic flux component ratio, and
   a radial distance between the magnetic detection unit and the magnet is adjusted such that the difference between the magnetic flux component ratio and the inverse of the sensitivity ratio is smaller as compared to when the magnetic detection unit is located at the radial center of the particular gap.

2. The rotation angle detection device according to claim 1, wherein
   the magnetic detection unit includes
      a horizontal Hall element that detects the radial magnetic flux component of the magnetic field, and
      a vertical Hall element that detects the tangential magnetic flux component of the magnetic field, and
      the vertical Hall element has a lower sensitivity than the horizontal Hall element.

3. The rotation angle detection device according to claim 1, wherein the radial distance between the magnetic detection unit and the magnet is adjusted such that the magnetic flux component ratio is equal to the inverse of the sensitivity ratio.

4. The rotation angle detection device according to claim 1, wherein
   a minimum width in the tangential direction necessary for providing the magnetic detection unit is defined as a minimum required width, and
   a tangential width of the particular gap is adjusted such that the difference between the magnetic flux component ratio and the inverse ratio of the sensitivity ratio is smaller as compared to when the tangential width of the particular gap is the minimum required width.

5. The rotation angle detection device according to claim 4, wherein the tangential width of the particular gap is adjusted such that the magnetic flux component ratio is equal to the inverse of the sensitivity ratio.

* * * * *